(12) United States Patent
Heragu et al.

(10) Patent No.: US 6,553,547 B1
(45) Date of Patent: Apr. 22, 2003

(54) METHOD AND SYSTEM FOR GENERATING CHARGE SHARING TEST VECTORS

(75) Inventors: Keerthinarayan P. Heragu, Irving, TX (US); Patrick W. Bosshart, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 197 days.

(21) Appl. No.: 09/713,416

(22) Filed: Nov. 15, 2000

Related U.S. Application Data

(60) Provisional application No. 60/179,314, filed on Jan. 31, 2000.

(51) Int. Cl.$^7$ ................................................ G06F 17/50
(52) U.S. Cl. ................................... 716/4; 716/5; 716/6
(58) Field of Search ........................ 716/4–6; 714/718, 714/721, 723, 724, 726, 727, 731, 733, 823; 708/671, 704

(56) References Cited

U.S. PATENT DOCUMENTS 6,094,734 A * 7/2000 Beffa et al. ................. 714/718
6,292,818 B1 * 9/2001 Winters ....................... 708/671
6,415,405 B1 * 7/2002 Horne et al. ................. 714/731

* cited by examiner

*Primary Examiner*—Matthew Smith
*Assistant Examiner*—Naum Levin
(74) *Attorney, Agent, or Firm*—Robert D. Marshall, Jr.; W. James Brady, III; Fredrick J. Telecky, Jr.

(57) ABSTRACT

A method for generating charge sharing test vectors for a circuit generates a first test vector (120) and a second test vector (122). The method provides a test model (98) including a logic cell (10) and an auxiliary test circuit (100) where the auxiliary test circuit (100) includes a discharge AND gate (102) and a charge sharing AND gate (104). The method generates a first test vector (120) for the test model (98) having an input pattern to discharge nodes of the logic cell (10) and evaluate discharge AND gate (102) to a logic level 1. The method generates a second test vector (122) having an input pattern to evoke the worst charge sharing behavior for the logic cell (10) and evaluate charge sharing AND gate (104) to a logic level 1.

9 Claims, 2 Drawing Sheets

METHOD AND SYSTEM FOR GENERATING CHARGE SHARING TEST VECTORS

This application claims priority under 35 USC §119(e)(1) of Provisional Application No. 60/179,314, filed Jan. 31, 2000.

TECHNICAL FIELD OF THE INVENTION

This invention relates in general to the field of integrated circuits and more particularly to a method and system for generating charge sharing test vectors.

BACKGROUND OF THE INVENTION

Integrated circuits designed using domino logic and/or dynamic logic are generally designed to minimize the effects of charge sharing. Charge sharing refers to redistribution of charge between two nodes in a circuit at different initial voltages when they are connected together. For example, suppose a first node has a high voltage and a second node has a low voltage. When they are connected together, the charge from the first node is redistributed in part to the second node. This redistribution may cause incorrect circuit operation since nodes that should carry a high voltage level may have their voltage level reduced to an extent that the value of the node is misinterpreted.

Conventional solutions to the problems of charge sharing include precharging one or more intermediate nodes by adding p-channel precharge transistors. Another conventional solution includes implementing dual logic and cross coupling the initial storage nodes of the dual logic using p-channel cross coupled transitors. Another conventional solution to the problem of charge sharing is to provide a feedback transistor to hold the initial storage node at a constant voltage level at the end of the precharge phase.

All of the conventional solutions to the problem of charge sharing include adding additional circuitry to the integrated circuit. Such additional circuitry, however, cannot generally be tested by integrated circuit testing techniques and automatic test pattern generators. As a result, the state of the circuitry under the influence of a set of manufacturing defects is not known.

SUMMARY OF THE INVENTION

In accordance with the present invention, a method and system for generating charge sharing test vectors is provided that substantially eliminates or reduces disadvantages and problems associated with conventional test vector generation. In particular, charge sharing test vectors are generated and used to test the correctness of circuit behavior under the influence of charge sharing.

According to an embodiment of the present invention, there is provided a method for generating charge sharing test vectors for a circuit that includes providing an automatic test pattern generator operable to generate a first test vector and a second test vector. The method further includes providing a test model including a logic cell of a circuit and an auxiliary test circuit where the auxiliary test circuit includes a discharge AND gate and a charge sharing AND gate. The method next provides for selecting an output of the discharge AND gate as a target for a falling transition fault test vector generation by the automatic test pattern generator. The method next provides for generating a first test vector for the test model using the automatic test pattern generator where the first test vector provides an input pattern to discharge nodes of the logic cell. In addition, the discharge AND gate evaluates to a logic level 1 for the first test vector. The method next provides for generating a second test vector for the test model using the automatic test pattern generator where the second test vector provides an input pattern to evoke the worst charge sharing behavior for the logic cell. In addition, the charge sharing AND gate evaluates to a logic level 1 for the second test vector.

The present invention provides various technical advantages. One technical advantage is that the test vectors provide for automatically testing the additional circuitry added to an integrated circuit to minimize charge sharing errors. As a result, the state of the charge sharing corrective circuits is known and operation of the integrated circuit is verified. Another technical advantage is that the function of the integrated circuit is not changed so as to enable successive generation of test vectors without recompiling the circuit.

Other technical advantages may be readily apparent to one skilled in the art from the following figures, description, and claims.

BRIEF DESCRIPTION OF THE DRAWINGS

For a more complete understanding of the present invention and the advantages thereof, reference is now made to the following description taken in conjunction with the accompanying drawings, wherein like reference numbers represent like parts, in which.

DETAILED DESCRIPTION OF THE DRAWINGS

Figure 1:
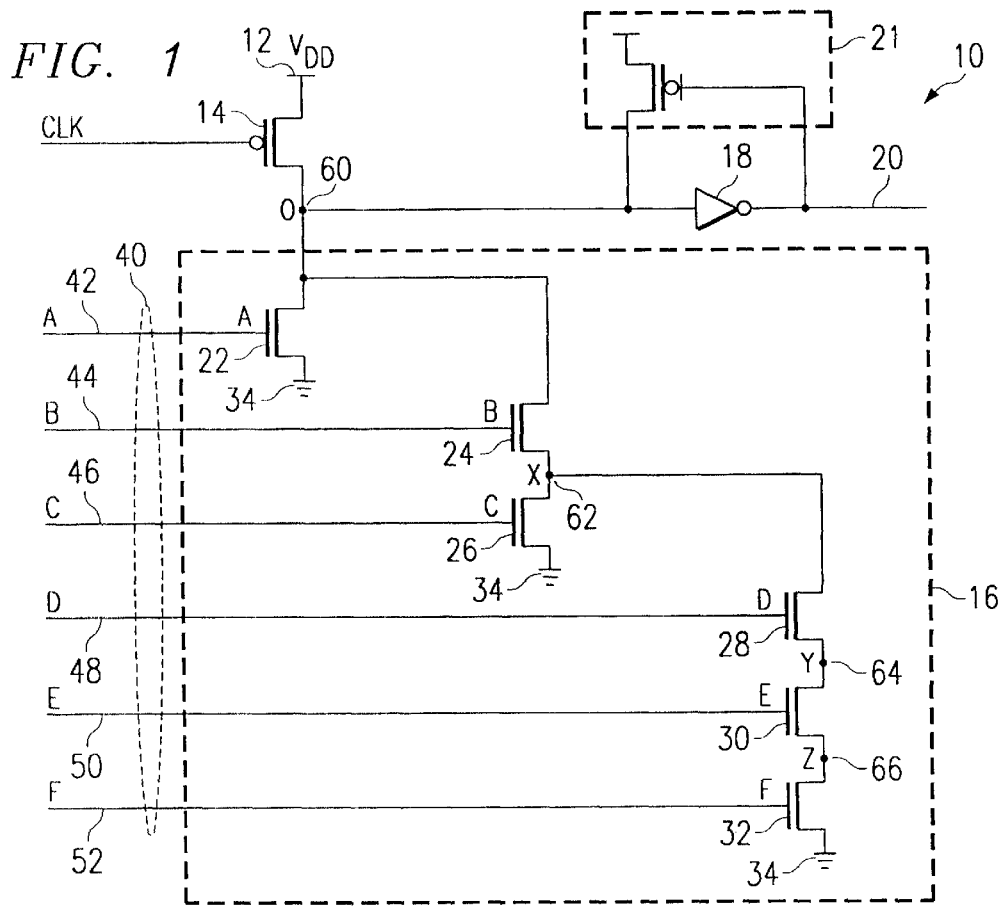
FIG. 1 illustrates a logic cell with charge sharing corrective circuits that may be tested in accordance with one embodiment of the present invention.

Referring to FIG. 1, a logic cell is generally indicated at 10. A circuit of an integrated circuit may have many logic cells that represent blocks of circuitry which can be independently tested and verified. The present invention applies to any circuit that exhibits charge sharing behavior such as domino circuits and other dynamic logic circuits. Logic cell 10 may be any suitable logic circuit including a dynamic logic circuit or domino logic circuit.

The logic cell 10 includes a power supply 12, a precharge transistor 14, a transistor network 16, an inverter 18, a logic cell output 20, and a charge sharing corrective circuit 21. Transistor network 16 further includes a transistor A 22, a transistor B 24, a transistor C 26, a transistor D 28, a transistor E 30, a transistor F 32, and a ground 34. Transistor network 16 receives input signals 40 that includes an input A 42, an input B 44, an input C 46, an input D 48, an input E 50, and an input F 52. Logic cell 10 also includes several points of capacitance referred to as nodes. These nodes may hold a charge and exist between pairs of transistors. Logic cell 10 includes an O node 60, an X node 62, a Y node 64, and a Z node 66. O node 60 is the initial storage node and exists between precharge transistor 14 and transistor A 22/transistor B 24. X node 62 exists between transistor B 24 and transistor C 26/transistor D 28. Y node 64 exists between transistor D 28 and transistor E 30. Z node 66 exists between transistor E 30 and transistor F 32. The exemplary embodiment of FIG. 1 is the logic function of: A+B(C+DEF).

Charge sharing corrective circuit 21 is additional circuitry added to logic cell 10 to account for charge sharing behavior that may be present in logic cell 10. In one embodiment, charge sharing corrective circuit 21 is a feedback p-channel transistor designed to hold the precharge level at O node 60 even if charge sharing behavior is present in transistor network 16. Charge sharing corrective circuit 21 may be any suitable charge sharing corrective circuit. Examples of other types of charge sharing corrective circuits include precharging one or more intermediate nodes by adding a p-channel precharge transistor to each intermediate node, implementing dual logic and cross-coupling the initial storage nodes of the dual logic, and implementing a dual rail cross-coupling circuit.

As applied to the exemplary embodiment in FIG. 1, charge sharing may exist between O node 60 and any other node connected to O node 60 through intervening transistors. For example, O node 60 is initially set to a logic level 1 and X node 62 is initially set to a logic level 0. If input B is a logic level 1 thereby connecting O node 60 with X node 62, the initial charge on O node 60 may be redistributed to X node 62 even though no path to ground 34 exists. If the voltage level at O node 60 falls below the logic level 1 threshold, O node 60 may be misinterpreted as a logic level 0. In the exemplary embodiment, a charge sharing corrective circuit 21 is added to logic cell 10 to minimize the charge sharing error. However, if the added circuitry suffers from a defect such as a stuck open transistor, incorrect operation may result. Traditional testing techniques may not evoke worst case charge sharing behavior and the stuck open condition may go unnoticed.

Figure 2:
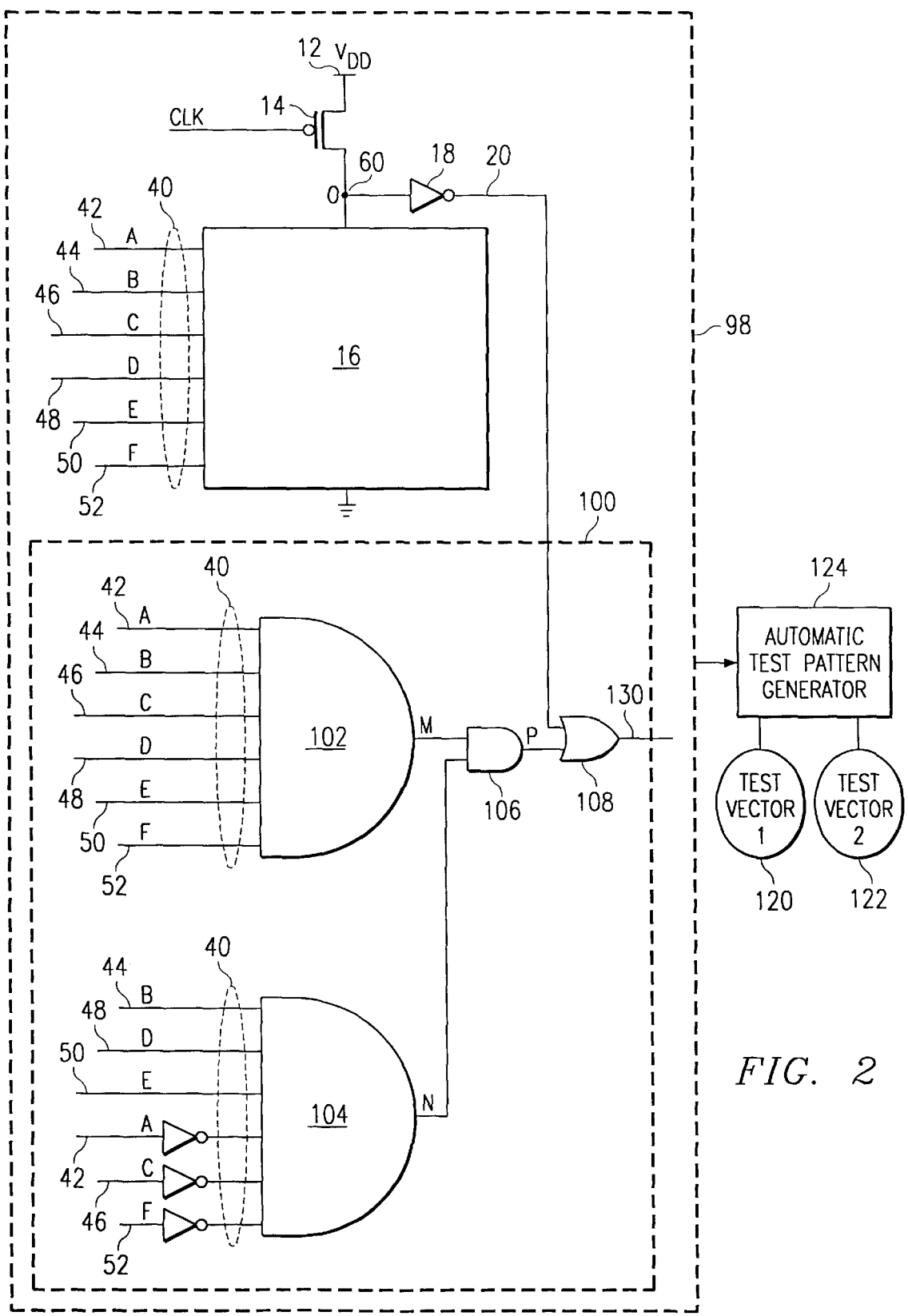
FIG. 2 illustrates a test model for the logic cell of FIG. 1 with an auxiliary test circuit in accordance with one embodiment of the present invention.

Referring to FIG. 2, a test model 98 that includes the logic cell 10 of FIG. 1 with an auxiliary test circuit 100 is illustrated. The test model 98 is used by an automatic test pattern generator (ATPG) 124 for generating a first test vector 120 and a second test vector 122. As described in more detail below, the first test vector is configured to provide an optimal discharge of all nodes in the logic cell 10. The second test vector 122 is configured to provide an optimal charge sharing state for the logic cell 10. Preferably, the optimal discharge and charging states are the maximum discharge and charging states, respectively. However, if due to design of the integrated circuit, the maximum states are not justifiable, then the optimal states are the maximum obtainable or substantially the maximum obtainable states.

The auxiliary test circuit 100 includes a first AND gate 102, a second AND gate 104, a third AND gate 106, an OR gate 108 and a boundary output 130. The automatic test pattern generator 124 may be any suitable test pattern generator for generating test vectors for integrated circuit testing including commercially available integrated circuit automatic test pattern generators. Test model 98 may be data or software stored on a computer readable medium and used for input to ATPG 124.

Test model 98 is presented to automatic test pattern generator 124 for generation of appropriate test vectors to verify the operational integrity of logic cell 10. In the case where logic cell 10 is part of a large integrated circuit, a modified version of the circuit consisting of test models of logic cells is presented to the automatic test pattern generator 124. The output test vectors are input into the integrated circuit inputs and are configured to provide the appropriate input at the logic cell 10. Thus, the integrated circuit inputs are processed by the integrated circuit and configured to generate the appropriate inputs at the logic cell 10.

For ease of illustration, input signals 40 are separately illustrated as providing input signals to transistor network 16, first AND gate 102, and second AND gate 104. However, input signals 40 are provided via a common input signal source. Input signals 40 that provide the input signals for transistor network 16 are fed directly to first AND gate 102. Input signals 40 of transistors in transistor network 16 that have sources connected to ground are inverted and fed into second AND gate 104. The inputs of the remaining transistors in transistor network 16 are fed directly to second AND gate 104. In the exemplary embodiment, input A 42, input C 46, and input F 52 are inverted and fed to second AND gate 104 since transistor A 22, transistor C 26, and transistor F 32 are all connected to ground 34. Input B 44, input D 48 and input E 50 are fed directly to second AND gate 104. The test model 98 is used for generating a first test vector 120 and a second test vector 122. This configuration allows for testing with maximum discharge and maximum charge sharing inputs, respectively. The inputs may be suitably modified to account for the maximum obtainable state of the vectors.

To generate charge sharing test vectors 120 and 122, test model 98 is input to an automatic test pattern generator 124 and the falling transition fault on the output of first AND gate 102 is targeted for test vector generation. Generation of a test for the falling transition fault provides for a logic level 1 on the output of first AND gate 102 during the first test vector 120. To obtain a logic level 1 on the output of the first AND gate 102, all input signals 40 are a logic level 1. Providing a logic level 1 for all input signals 40 leads to discharging of all intermediate nodes in logic cell 10 since all paths to ground 34 are connected. In the exemplary embodiment, O node 60, X node 62, Y node 64, and Z node 66 are all discharged. The second test vector 122 generated by the automatic test pattern generator 124 provides for a logic level 1 on the output of second AND gate 104. To accomplish this, the input signals 40 for transistors that have sources connected to ground are set a logic level 0, and the remaining input signals 40 are set to a logic level 1. The second test vector 122 ensures that no direct path to ground is available thereby evoking the worst case charge sharing behavior for the logic cell 10. Since logic cell 10 does not provide a direct path to ground for any signal path, the second test vector 122 insures observability of any charge sharing and evokes the worst charge sharing behavior for logic cell 10. If any element in the additional circuitry added to minimize charge sharing exhibits a fault, the second test vector 122 insures observability of that fault thereby providing a test for the additional circuitry.

Since first AND gate 102 and second AND gate 104 are complementary, the output of third AND gate 106 should always be a logic level 0. Since the output of third AND gate 106 is a logic level 0, the output of OR gate 108 is equal to logic cell output 20 and provides a boundary output 130 for verifying the result of first test vector 120 and second test vector 122.

The generation of the first test vector 120 and the second test vector 122 for the falling transition fault of the output of first AND gate 102 provides a stuck-at-1 fault test on the output of first AND gate 102 at boundary output 130 on the second test vector 122. A stuck-at-0 fault test on O node 60 may be observed on the second test vector 122. First test vector 120 initializes logic cell 10 in preparation for the falling transition fault test of second test vector 122.

The generated test vectors automatically evoke the worst charge sharing behavior, and if charge sharing changes the O node 60 voltage to a logic level 0 on the second test vector 122, the charge sharing effect is observed at boundary output 130. The auxiliary test circuit 100 is only added to test model 98. It is not added to the actual integrated circuit. It is added only to the test model 98 that is given to the automatic test pattern generator 124 such that appropriate test vectors 120 and 122 can be generated.

Figure 3:
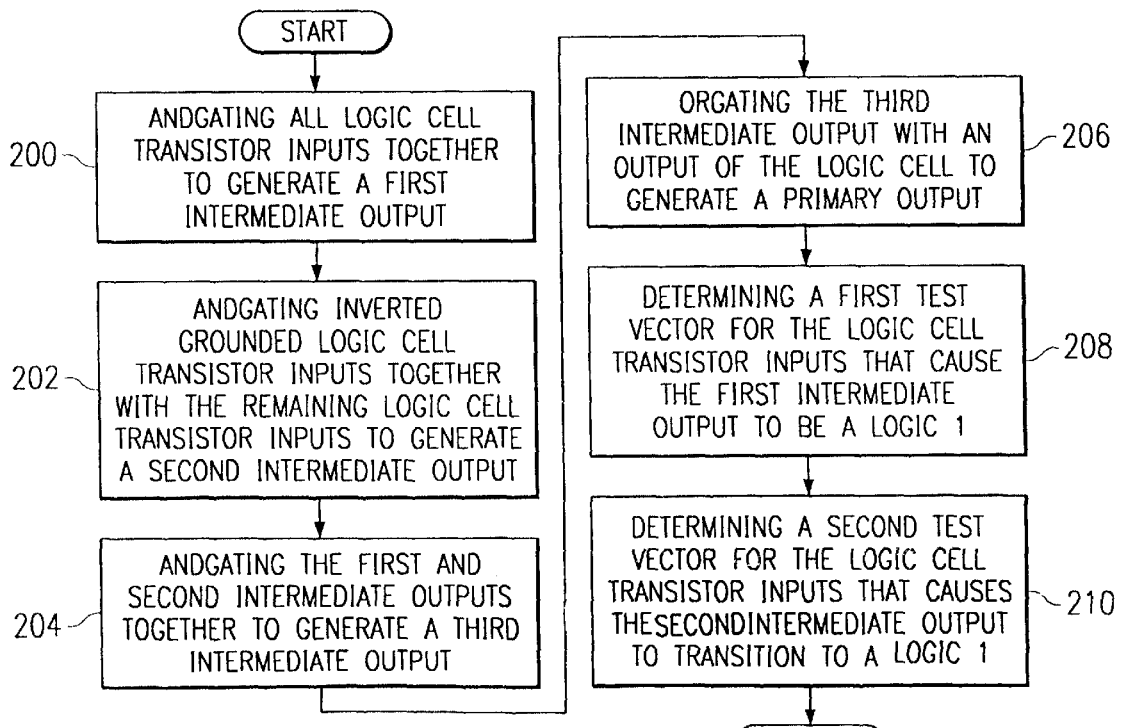
FIG. 3 is a flow diagram illustrating a method for generating test vectors in accordance with one embodiment of the present invention.

Referring to FIG. 3, a flow diagram illustrates a method for generating test vectors in accordance with one embodiment of the present invention. The method commences at step 200 where all logic cell 10 transistor inputs are ANDed together to generate a first intermediate output. In the exemplary embodiment, input signals 40 are fed to first AND gate 102 to generate the first intermediate output on the output of first AND gate 102.

The method proceeds to step 202 where inverts of the inputs to transistors, whose sources are grounded, are ANDed together with the remaining logic cell transistor inputs to generate a second intermediate output. In the exemplary embodiment, transistor A 22, transistor C 46, and transistor F 52 are all coupled to ground 34 and are thus inverted and fed to second AND gate 104. In addition, transistor B 44, transistor D 48, and transistor E 50 are fed directly to second AND gate 104. Second AND gate 104 generates the second intermediate output on the output of second AND gate 104.

The method proceeds to step 204 where the first intermediate output and the second intermediate output are ANDed together to generate a third intermediate output. In the exemplary embodiment, the output of first AND gate 102 and the output of second AND gate 104 are fed to third AND gate 106 to generate the third intermediate output on the output of third AND gate 106.

The method proceeds to step 206 where the third intermediate output is ORed with an output of the logic cell to generate a primary output. In the exemplary embodiment, the output of third AND gate 106 is fed to OR gate 108, and logic cell output 20 is fed to OR gate 108 to generate boundary output 130. Steps 200 through 206 represent the auxiliary test circuit 100 of FIG. 2.

The method proceeds to step 208 where test model 98 is forwarded to automatic test pattern generator 124 that then determines a first test vector 120 for the logic cell transistor inputs 40 that cause the first intermediate output to be a logic level 1. In the exemplary embodiment, the first intermediate output is the output of first AND gate 102.

The method proceeds to step 210 where the automatic test pattern generator 124 determines a second test vector 122 for the logic cell transistor inputs 40 that cause the first intermediate output to transition to a logic level 0.

Thus, it is apparent that there has been provided in accordance with the present invention, a method for generating charge sharing test vectors that satisfies the advantages as set forth above such as providing automatic generation of test vectors to test for charge sharing errors in integrated circuits. Although the present invention and its advantages have been described in detail, it should be understood that various changes, substitutions, and alterations may be readily apparent to those skilled in the art and may be made without departing from the spirit and the scope of the present invention as defined by the following claims.

What is claimed is:

1. A method for generating charge sharing test vectors for a circuit periodically precharging a node to a first voltage and conditionally discharging the node to ground via a logic cell, the logic cell receiving a plurality of input signals and including a plurality of transistors, each transistor having a gate receiving a corresponding logic signal and a source-drain path, the source-drain paths together forming at least one discharge path between the node and a source of a second voltage, the method comprising:

providing an automatic test pattern generator operable to generate a first test vector and a second test vector;

providing a test model including a logic cell of a circuit and an auxiliary test circuit;

setting first input signals for all transistors of the logic cell to a logic level 1, the input signals providing an input pattern for the automatic test pattern generator;

generating a first test vector according to said first input signals for the test model using the automatic test pattern generator, the first test vector providing an input pattern of input signals to discharge nodes of the logic cell;

setting second input signals for all transistors of the logic cell connected to ground to a logic level 0;

setting third input signals for all transistors of the logic cell not connected to ground to a logic level 1;

generating a second test vector according to said second and third input signals for the test model using the automatic test pattern generator, the second test vector providing an input pattern to evoke a worst charge sharing behavior for the circuit.

2. The method of claim 1, wherein the logic cell is a domino circuit.

3. The method of claim 1, wherein the logic cell is a dynamic circuit.

4. A method for generating charge sharing test vectors for a circuit, comprising:

providing an automatic test pattern generator operable to generate a first test vector and a second test vector;

providing a test model including a logic cell of a circuit and an auxiliary test circuit, the auxiliary test circuit including a first AND gate, a second AND gate, a third AND gate, and an OR gate;

setting inputs for all sources of the logic cell to a logic level 1, the input values providing an input pattern for the automatic test pattern generator;

generating a first test vector for the test model using the automatic test pattern generator, the first test vector providing an input pattern to discharge nodes of the logic cell;

setting inputs for sources of the circuit connected to ground to a logic level 0;

setting inputs for sources of the circuit not connected to ground to a logic level 1;

generating a second test vector for the test model using the automatic test pattern generator, the second test vector providing an input pattern to evoke the worst charge sharing behavior for the circuit.

5. The method of claim 4, further comprising: targeting an output of the first AND gate for a falling transition fault test vector generation by the automatic test pattern generator.

6. A method for charge sharing testing of circuits, comprising:

precharging an output node to a logic level 1;

setting source inputs to values such that a path to ground is provided for source components associated with the source inputs;

discharging source components of the circuit;

precharging the output node to a logic level 1;

setting source inputs to values such that sources coupled to ground are a logic level 0 and that other sources are a logic level 1;

evaluating the output node value;

generating an error condition in response to the output node value evaluating to a logic level 0 indicating a charge sharing error.

7. A test model for generating charge sharing test vectors for a circuit, comprising:
   a logic cell of an integrated circuit including additional circuitry to minimize charge sharing between nodes in the logic cell;
   an auxiliary test circuit coupled to the logic cell, the logic cell and auxiliary test circuit operable to provide a test model for test vector generation, the auxiliary test circuit includes a first AND gate, a second AND gate, a third AND gate, and an OR gate;
   an automatic test pattern generator operable to generate test vectors for the test model, the test vectors used for verifying the operation of the additional circuitry designed to minimize charge sharing.

8. The method of claim 7, further comprising: targeting an output of the first AND gate for a falling transition fault test vector generation by the automatic test pattern generator.

9. A method for charge sharing testing a circuit periodically precharging a node to a precharge voltage and conditionally discharging the node to ground via a logic cell, the logic cell receiving a plurality of input signals and including a plurality of transistors, each transistor having a gate receiving a corresponding logic signal and a source-drain path, the source-drain paths together forming at least one discharge path between the node and ground, the method comprising:
   generating a first test vector consisting of input signals operable to cause the source-drain path of all transistors of the logic cell to be conducting thereby to optimize discharge of nodes in the logic cell;
   applying the first test vector to the circuit;
   generating a second test vector consisting of input signals operable to cause the source-drain path of transistors of the logic cell connected to ground to be non-conducting and the source-drain paths of all other transistors to be conducting thereby to optimize charge sharing between nodes in the logic cell;
   applying the second test vector to the circuit; and
   measuring a primary output from the circuit to determine a fault status of a charge sharing corrective circuit for the circuit.

* * * * *